US008368030B2

(12) United States Patent
Platzgummer et al.

(10) Patent No.: US 8,368,030 B2
(45) Date of Patent: Feb. 5, 2013

(54) CHARGED PARTICLE BEAM EXPOSURE SYSTEM AND BEAM MANIPULATING ARRANGEMENT

(75) Inventors: Elmar Platzgummer, Vienna (AT); Gerhard Stengl, Wernberg (AT)

(73) Assignee: Carl Zeiss SMS GmbH, Jena (DE)

( * ) Notice: Subject to any disclaimer, the term of this patent is extended or adjusted under 35 U.S.C. 154(b) by 682 days.

(21) Appl. No.: 11/988,922

(22) PCT Filed: Jul. 20, 2006

(86) PCT No.: PCT/EP2006/007182
§ 371 (c)(1),
(2), (4) Date: Jan. 17, 2008

(87) PCT Pub. No.: WO2007/009804
PCT Pub. Date: Jan. 25, 2007

(65) Prior Publication Data
US 2009/0140160 A1    Jun. 4, 2009

(30) Foreign Application Priority Data
Jul. 20, 2005 (EP) .................................. 05015781

(51) Int. Cl.
*G21K 5/04* (2006.01)
(52) U.S. Cl. ................ 250/396 R; 250/306; 250/492.1; 250/492.3
(58) Field of Classification Search ............. 250/396 R, 250/397, 398, 492.1, 492.2, 492.21, 492.3; 430/296, 298, 299
See application file for complete search history.

(56) References Cited

U.S. PATENT DOCUMENTS

| 2,581,446 | A | * | 1/1952 | Robinson | 313/250 |
| 3,870,882 | A | * | 3/1975 | Larson | 250/305 |
| 4,775,797 | A | | 10/1988 | Stengl et al. | |
| 5,262,341 | A | | 11/1993 | Fueki et al. | |
| 5,428,203 | A | * | 6/1995 | Kusunose | 219/121.25 |
| 5,631,113 | A | * | 5/1997 | Satoh et al. | 430/30 |
| 5,742,065 | A | * | 4/1998 | Gordon et al. | 250/492.23 |
| 5,793,156 | A | | 8/1998 | Han et al. | |
| 5,814,423 | A | | 9/1998 | Maruyama et al. | |

(Continued)

FOREIGN PATENT DOCUMENTS

| JP | 10-223529 A | 8/1998 |
| JP | 2002-203766 A | 7/2002 |

(Continued)

OTHER PUBLICATIONS

International Search Report for PCT App. No. PCT/EP2006/007182 dated Sep. 15, 2006.

(Continued)

*Primary Examiner* — David A Vanore
*Assistant Examiner* — Nicole Ippolito
(74) *Attorney, Agent, or Firm* — Bruce D Riter

(57) ABSTRACT

A beam manipulating arrangement for a multi beam application using charged particles comprises a multi-aperture plate having plural apertures traversed by beams of charged particles. A frame portion of the multi-aperture plate is heated to reduce temperature gradients within the multi-aperture plate. Further, a heat emissivity of a surface of the multi-aperture plate may be higher in some regions as compared to other regions in view of also reducing temperature gradients.

18 Claims, 4 Drawing Sheets

U.S. PATENT DOCUMENTS

| | | | |
|---|---|---|---|
| 5,977,550 A * | 11/1999 | Nakasuji | 250/492.2 |
| 6,014,200 A | 1/2000 | Sogard et al. | |
| 6,465,796 B1 | 10/2002 | Haraguchi et al. | |
| 6,774,379 B2 | 8/2004 | Hashimoto | |
| 2003/0025088 A1 | 2/2003 | Oae et al. | |
| 2003/0209676 A1* | 11/2003 | Loschner et al. | 250/492.2 |
| 2007/0215812 A1* | 9/2007 | Doering et al. | 250/396 ML |

FOREIGN PATENT DOCUMENTS

| | | |
|---|---|---|
| JP | 2002-203776 A | 7/2002 |
| JP | 2002-260988 A | 9/2002 |

OTHER PUBLICATIONS

European Search Report dated Jan. 3, 2006 for priority application No. 05015781.7.

International Search Report for corresponding International Application No. PCT/EP2006/007182 dated Sep. 15, 2006.

English-language translation of Office Action dated Jun. 21, 2012 from parallel Korean patent application No. 10-2008-7003887.

Office Action dated Aug. 30, 2011 from parallel Japanese patent application No. 2008-521903 (with English-language translation).

* cited by examiner

US 8,368,030 B2

CHARGED PARTICLE BEAM EXPOSURE SYSTEM AND BEAM MANIPULATING ARRANGEMENT

CROSS REFERENCE TO RELATED APPLICATION

This application is the National Phase application of International Application No. PCT/EP2006/007182, filed Jul. 20, 2006, which designates the United States and was published in English. This application, in its entirety, is incorporated herein by reference.

BACKGROUND OF THE INVENTION

1. Field of the Invention

The present invention relates to a charged particle beam exposure system used, for example, in a lithographic method, and a beam manipulating arrangement for manipulating a plurality of charged particle beams.

2. Brief Description of Related Art

Lithographic processes are commonly used in the manufacture of miniaturized structures, such as semiconductor elements, integrated circuits, liquid crystal elements, micro-patterned members and micro-mechanical components.

A lithographic process comprises a plurality of lithographic steps in which patterns or structures to be formed on a substrate are imaged onto the substrate to expose a radiation sensitive layer provided on the substrate. The radiation sensitive layer, which is commonly referred to as a resist, may be exposed by optical radiation, such as visible or ultraviolet light, or by charged particles, such as ions or electrons. In the imaging of patterns using charged particles, a conventional method uses a plurality of charged particle beams or beamlets for writing the pattern onto the resist, wherein the beams or beamlets can be selectively switched on and off while the substrate carrying the resist is moved relative to the array of switchable beams.

The switchable beams are controlled by a deflector plate having a plurality of apertures traversed by the beams. Each aperture has a deflector associated therewith for selectively deflecting the beam traversing the aperture by a sufficient angle such that the beam will not reach the substrate carrying the resist. Such type of multi-aperture plate is also referred to as a blanking aperture plate (BAA) in the art. Background information on charged particle beam exposure systems using a plurality of charged particle beams controlled by a blanking aperture array may be obtained from US 2003/0025088 A1, the contents of which are incorporated herein by reference.

In the conventional system using a multi-aperture plate for controlling the charged particle beams, the plurality of beams is formed by generating a beam incident on the multi-aperture plate and extending across a plurality of apertures on the plate. A portion of the charged particles incident on the plate may traverse the plate through the apertures such that an array of charged particle beams is formed downstream of the multi-aperture plate. The other portion of charged particle beams is intercepted by the plate. Further, the multi-aperture plate carries the deflectors associated with each of the apertures, and the multi-aperture plate carries also the circuitry necessary for controlling switching states of the deflectors.

It has been found that the conventional system of exposing a pattern using a plurality of controlled charged particle beams may have an insufficient performance in some applications.

SUMMARY OF THE INVENTION

The present invention has been accomplished taking the above problems into consideration.

Embodiments of the present invention provide a beam manipulating arrangement comprising at least one multi-aperture plate having a central portion defining a plurality of apertures, and a frame portion outside of the central portion; and at least one heater thermally coupled to the frame portion of the multi-aperture plate.

The multi-aperture plate may have a function of generating a plurality of beams traversing the apertures from a larger beam incident on the multi-aperture plate. The multi-aperture plate may also have a function of shaping a plurality of small beams traversing the apertures from larger beams incident on the apertures. Further, the multi-aperture plate may also have a function of deflecting beams traversing the apertures by deflectors associated with the apertures and carried by the multi-aperture plate and controlled by a circuitry provided on the multi-aperture plate.

The beam or beams incident on the multi-aperture plate and the operation of the electronic circuitry controlling the deflectors generate heat resulting in a rise of temperature of the central portion of the multi-aperture plate during operation of the beam manipulating arrangement. The heater which is thermally coupled to the frame portion allows to introduce a rise of temperature also in the frame portion of the multi-aperture plate such that changes of internal stress, such as tensile or compressive stress, in the multi-aperture plate are reduced as compared to a situation where the rise of temperature is only generated in the central portion of the plate. Such changes of internal stress might result in an inhomogeneous deformation or bulging of the central portion and, thus, in a distorted pattern of the arrangement of the plurality of apertures.

According to a further embodiment of the present invention, a beam manipulating arrangement for deflecting a plurality of charged particle beams comprises a deflector plate having a central portion defining a plurality of apertures, and a frame portion outside of the central portion, the deflector plate carrying a plurality of deflectors and a switching circuitry, wherein each of the plurality of apertures has a deflector associated therewith, the deflector being electrically connected to the switching circuitry and configured to deflect a charged particle beam traversing the aperture; a protective plate disposed opposite to the deflector plate such that a gap is formed between the protective plate and the deflector plate, the protective plate having a central portion defining a plurality of apertures and a frame portion outside of the central portion, wherein the apertures of the protective plate are registered relative to the apertures of the deflector plate such that the beams of charged particles may traverse the protective plate and the deflector plate; and at least one heater thermally coupled to at least one of the frame portion of the deflector plate and the frame portion of the protective plate.

In such arrangement, the deflector plate has a function of deflecting the beams traversing the apertures, while the protective plate has a function of shaping or generating the plurality of beams upstream of the deflector plate.

In one embodiment herein, the at least one heater is thermally coupled to the frame portion of the deflector plate such that a rise in temperature of the frame portion may be generated together with a rise in temperature of the central portion due to the operation of the circuitry for controlling a deflection state of electrodes associated with the apertures.

In another embodiment herein, the at least one heater is thermally coupled to the frame portion of the protective plate to generate a rise in temperature of the frame portion together with a rise in temperature of the central portion due to energy deposited by charged particles which are incident on the substrate material defining the apertures in the central portion.

According to a further embodiment, a first heater is thermally coupled to the frame portion of the deflector plate, and a second heater is thermally coupled to the frame portion of the protective plate, such that the temperatures of the frame portions of the deflector and protective plates may be individually controlled.

According to an exemplary embodiment of the invention, a gap is formed between the heater and the frame portion of the deflector plate and the protective plate, respectively, such that the thermal coupling between the heater and the respective frame portion is provided by radiation heat transmission rather than heat conduction. Heat conduction would require a mechanical contact between the heater and the respective frame portion which might introduce additional tensile stresses.

According to a further exemplary embodiment, the beam manipulating arrangement comprises at least one heat sink having an inner heat receiving surface surrounding at least one of the beam or beams incident on the protective plate, and the beams having traversed the deflector plate. Such heat sink allows for a radiation cooling of the central portions of the respective plates such that a temperature gradient between the central portion and the frame portion is reduced.

According to an exemplary embodiment herein, the heater is disposed radially outwardly from the heat sink, when seen from the central portion of the respective plate.

According to an exemplary embodiment herein, the inner surface of the heat sink facing towards the central portion has a higher thermal emissivity than a surface of the heat sink facing towards the heater. This may avoid an undesired heat transfer between the heater and the heat sink.

According to an exemplary embodiment, the heat sink may comprise a liquid pipe for controlling a temperature thereof, and the heater may comprise a resistance heating for controlling a temperature thereof.

According to a further embodiment of the present invention, a beam manipulating arrangement for deflecting a plurality of charged particle beams comprises a deflector plate having a central portion defining a plurality of apertures, and a frame portion outside of the central portion, the deflector plate carrying a plurality of deflectors and a switching circuitry, wherein each of the plurality of apertures has a deflector associated therewith, the deflector being electrically connected to the switching circuitry and configured to deflect a charged particle beam traversing the aperture; and a protective plate disposed opposite to the deflector plate such that a gap is formed between the protective plate and the deflector plate, the protective plate having a central portion defining a plurality of apertures and a frame portion outside of the central portion, wherein the apertures of the protective plate are registered relative to the apertures of the deflector plate such that the beams of charged particles may traverse the protective plate and the deflector plate; wherein the switching circuitry comprises a plurality of circuit device elements, wherein the central portion of the deflector plate has a first region in which a number of circuit device elements per unit area of the deflector plate has a first value, wherein the central portion of the deflector plate has a second region in which the number of circuit device elements per unit area of the deflector plate has a second value greater than the first value; wherein at least one of first and second surfaces of the protective plate has a first region opposite the first region of the deflector plate having a first heat emissivity, and a second region opposite the second region of the deflector plate having a second heat emissivity greater than the first heat emissivity.

The deflector plate has regions where the number of apertures per unit area is higher than in other regions. Further, the number of circuit device elements for controlling the deflectors associated with the apertures may vary between different regions of the central portion of the deflector plate. It is apparent that a heat per unit area of the central portion generated by the operation of the circuit device elements or by charged particles incident on the substrate material defining the apertures will vary across the area of the central portion of the deflector plate. There will be regions where an amount of heat introduced into the substrate material of the central portion is higher than in other regions. In view of reducing temperature gradients across the central portion, a radiation cooling mechanism of the central portion is designed such that heat is more effectively carried away from regions where more heat is generated than in regions where the heat generated per unit area is lower. This is achieved by varying a heat emissivity of a surface of the central portion of the deflector plate from region to region. This may be further achieved by varying a heat emissivity of a surface of the protective plate facing towards the deflector plate.

The varying heat emissivity of the surfaces of the deflector plate and the protective plate may be achieved by a structured coating of the respective surfaces.

According to a still further embodiment of the present invention, a beam manipulating arrangement for deflecting a plurality of charged particle beams comprises a deflector plate having a central portion defining a plurality of apertures, and a frame portion outside of the central portion, the deflector plate carrying a plurality of deflectors and a switching circuitry, wherein each of the plurality of apertures has a deflector associated therewith, the deflector being electrically connected to the switching circuitry and configured to deflect a charged particle beam traversing the aperture; a protective plate disposed opposite to the deflector plate such that a gap is formed between the protective plate and the deflector plate, the protective plate having a central portion defining a plurality of apertures and a frame portion outside of the central portion, wherein the apertures of the protective plate are registered relative to the apertures of the deflector plate such that the beams of charged particles may traverse the protective plate and the deflector plate; and at least one ball disposed between the deflector plate and the protective plate, wherein the ball is engaged with a groove formed in the frame portion of the deflector plate and with a groove formed in the frame portion of the protective plate.

In an exemplary embodiment herein, three balls are disposed at a distance from each other for defining the gap between the deflector plate and the protective plate.

The balls allow to maintain a position of the plates relative to each other by providing a well-defined mechanical contact between the plates. Further, the balls allow for a thermal expansion of one plate relative to the other without generating tensile or compressive stresses between the plates. Further, a transfer of heat from one plate to the other by heat conduction is relatively low due to the small contact area between the balls and the plates.

According to further embodiments of the present invention, a charged particle beam system comprises a charged particle source for generating at least one beam of charged particles, a beam manipulating arrangement disposed in a beam path of the at least one beam of charged particles, a stage for mounting a substrate surface in a target plane relative to the beam manipulating arrangement, and a charged particle optics configured to direct beams of charged particles traversing apertures of the beam manipulating arrangement onto the target plane. The beam manipulating arrangement may be configured as illustrated above.

According to an exemplary embodiment herein, the charged particle beam system is a charged particle beam exposure system comprising a controller for controlling deflectors of the beam manipulating arrangement to selectively deflect charged particle beams traversing the apertures of the beam manipulating arrangement.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
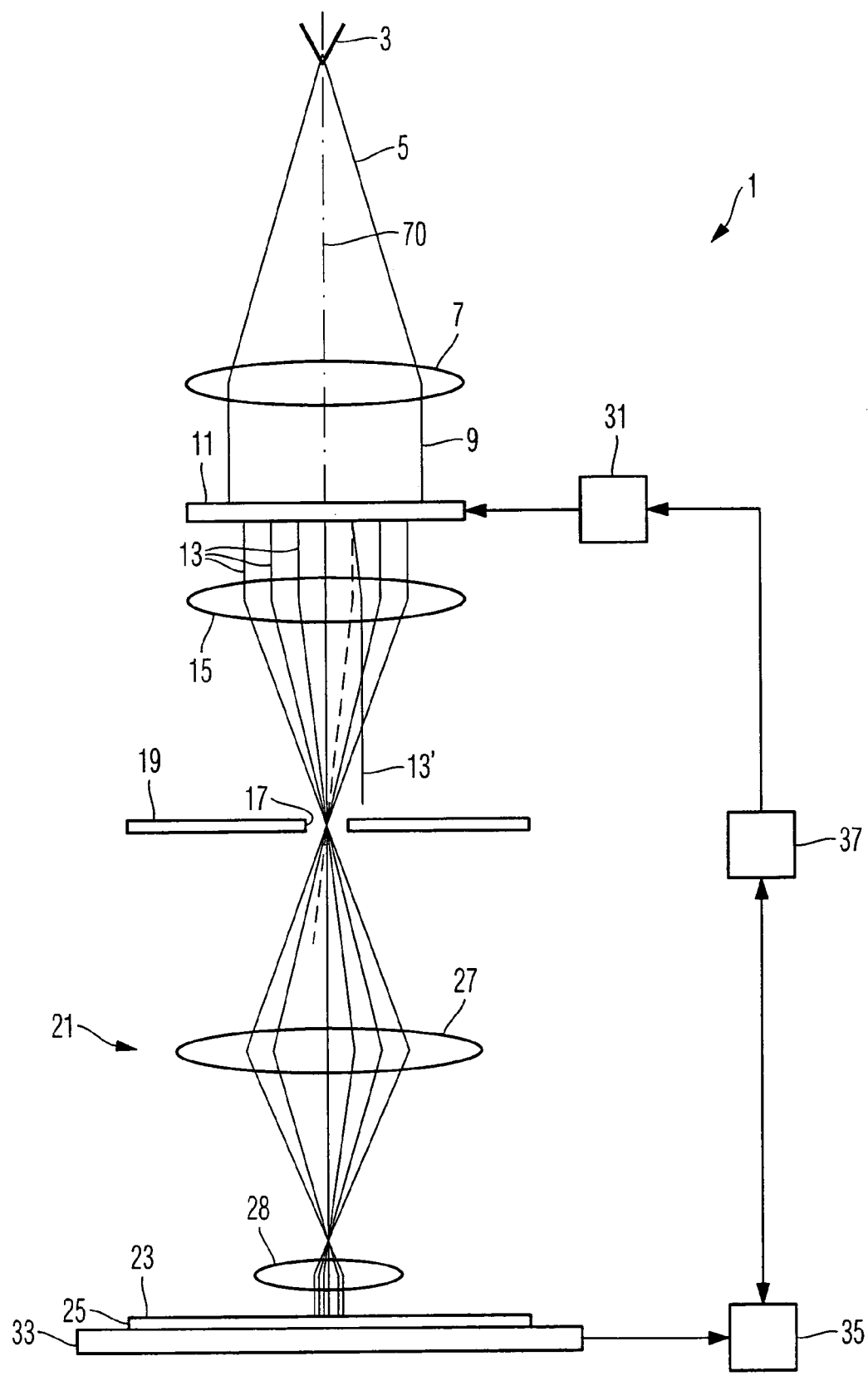
FIG. 1 schematically illustrates a charged particle beam exposure system according to an embodiment of the present invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 illustrates a charged particle beam exposure system using a plurality of electron beams for exposing a pattern onto a substrate, such as a semiconductor wafer.

The system uses a deflector plate having a plurality of apertures and deflectors associated therewith for individually controlling the plurality of beams. Background information on such types of exposure systems and in particular methods of operations thereof and manufacturing of multi-aperture plates incorporated therein may be obtained from US 2003/0025088 A1, U.S. Pat. No. 5,262,341, U.S. Pat. No. 5,814,423 and U.S. Pat. No. 6,465,796 B1, the contents of which are incorporated herein by reference.

A charged particle beam exposure system 1 schematically illustrated in FIG. 1 comprises an electron beam source 3 emitting a divergent beam of electrons 5 which is collimated by a suitable lens arrangement 7, such as a magnetic lens arrangement or an electrostatic lens arrangement, to form a parallel beam 9 of electrons which is incident on a beam manipulating arrangement 11.

The beam manipulating arrangement 11 includes a plate defining a plurality of apertures which are traversed by electrons of beam 9 such that a plurality of electron beams 13 or electron beamlets is formed downstream of the beam manipulating arrangement 11. The schematic illustration of FIG. 1 shows a number of seven beams 13 traversing the beam manipulating arrangement 11 for illustrative purposes. In practice, the number of beams 13 is higher, and several hundreds of beams, more than one thousand beams, or even more than one hundred thousand beams are formed downstream of the beam manipulating arrangement.

The array of beams 13 formed downstream of the beam manipulating arrangement 11 is focused by a lens arrangement 15, traverses a central hole 17 of an aperture plate 19 and is projected by an objective lens arrangement 21 onto a surface 23 of a semiconductor wafer 25. The surface 23 of the semiconductor wafer 25 is covered with a resist which is exposed with the pattern of beams 13 having traversed the aperture plate 19. The focusing lens arrangement 15 and the objective lens arrangement 21 are configured such that the beams 13 generate a demagnified image of the apertures formed in the beam manipulating arrangement 11. In the schematic representation of FIG. 1, the objective lens arrangement 21 comprises two lenses 27 and 28 for generating the demagnified image. However, the objective lens arrangement may have three or more individual lenses generating plural overlapping electric and magnetic fields. Also the focusing lens 15 may be formed by a magnetic lens arrangement or an arrangement of electrostatic lenses.

As will illustrated in more detail below, each of the apertures provided in the beam manipulating arrangement 11 is associated with a deflector which may be controlled to deflect the beam 13 traversing the respective aperture. If the deflector is not energized, the beam 13 will traverse the beam manipulating arrangement 11 substantially along a straight line. If the deflector is energized, the respective beam traversing the aperture and deflector will be deflected by a sufficient angle such that the beam will not be able to traverse the central hole 17 formed in the aperture plate 19. The schematic illustration of FIG. 1 indicates one such deflected beam with reference numeral 13'. Beam 13' is intercepted by the aperture plate 19 and is not projected onto the surface 23 of the wafer 15. All other exemplary beams 13 shown in FIG. 1 are not deflected by the deflector associated with the respective aperture, and these beams are projected onto the surface 23 of the wafer 25.

The deflectors are controlled by a pattern generator 31 such that the individual beams 13 reaching the wafer 25 may be selectively switched on and off such that an exposure pattern currently formed on the wafer may be controlled by the pattern generator 31.

The wafer 25 is mounted on a wafer stage 33 which can be displaced relative to the objective lens arrangement 21 by a stage drive control mechanism 35 which is controlled by a main controller 37. The stage drive control mechanism also includes a laser interferometer (not shown in FIG. 1) continuously measuring the position of the stage 33 relative to the other components, such as the objective lens 21, of the exposure system 1, wherein a signal indicative of the current position of a stage 33 and wafer 25 is supplied to the main controller 37. The main controller 37 controls the stage drive control mechanism 35 and the pattern generator 31 such that a desired pattern is exposed onto the wafer surface 23 by continuously moving the wafer 25 relative to the objective lens 21 and selectively switching on and off the beams 13 projected onto the wafer surface 23.

Figure 2:
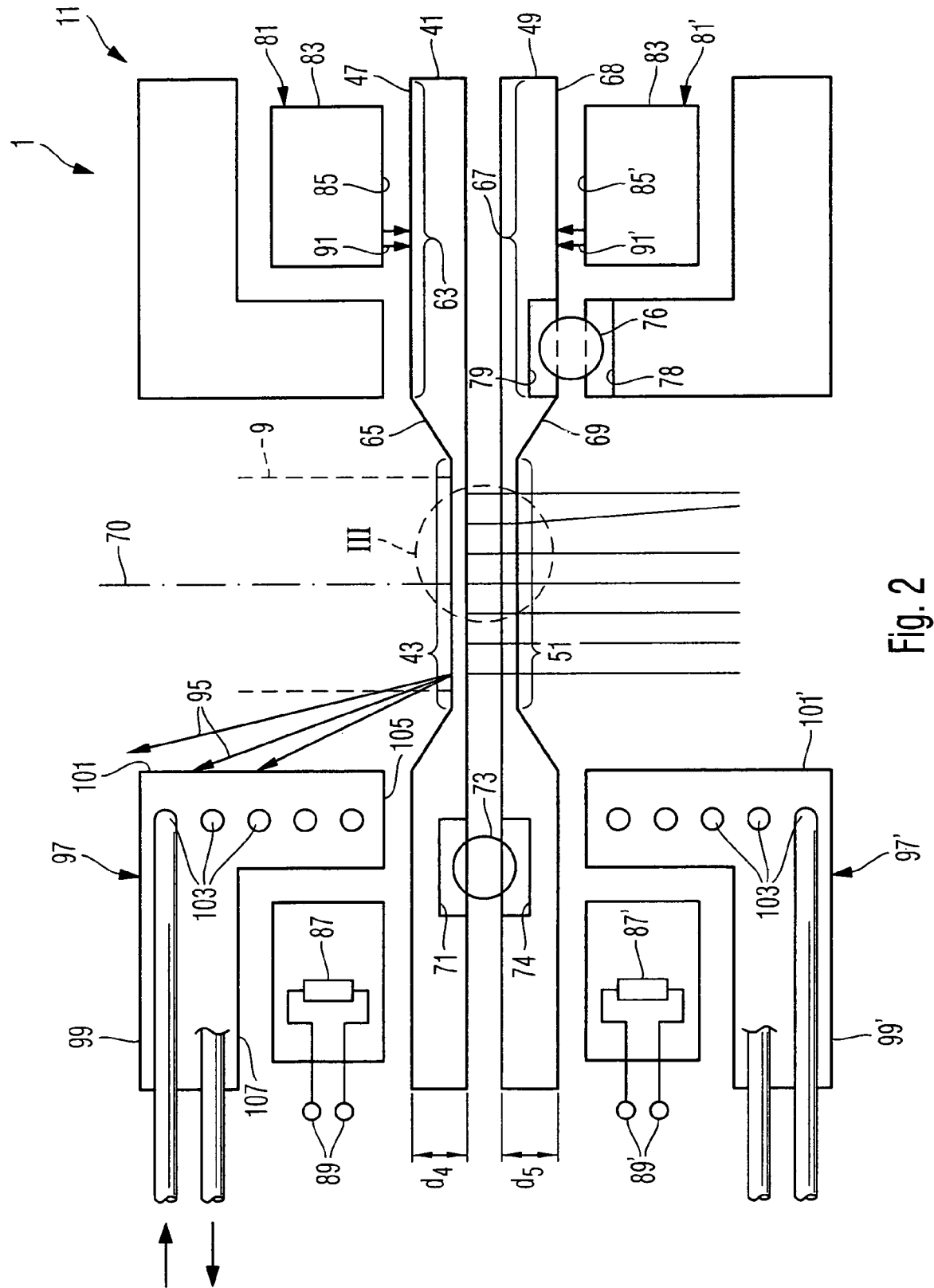
FIG. 2 illustrates a beam manipulating arrangement of the system shown in FIG. 1.
Figure 3:
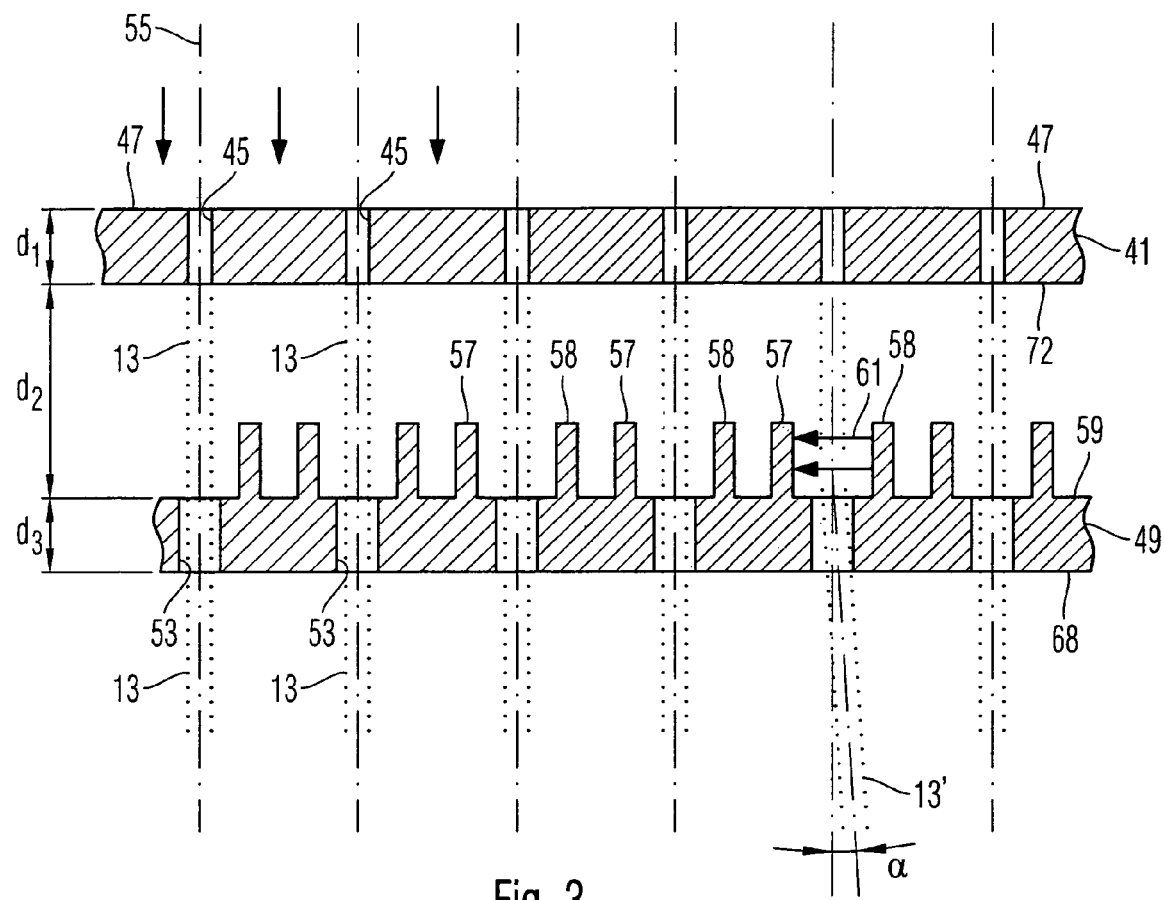
FIG. 3 is an enlarged sectional partial view of FIG. 2.

FIG. 2 is a detailed view of the beam manipulating arrangement 11 of the electron beam exposure system 1, and FIG. 3 shows an enlarged portion indicated by III in FIG. 2.

The beam manipulating arrangement 11 comprises a protective plate 41 disposed in a beam path of electron beam 9. The protective plate 41 is made of a monocrystalline silicon substrate 12 and has a central portion 43 having a thickness $d_1$ of about 20 μm to about 50 μm. The central portion 43 defines a plurality of apertures 45 or through-holes having an inner diameter of about 5 μm in the present example. The electrons of electron beam 9 are either absorbed by the upper surface 47 of the protective plate 41 or traverse the through-holes 45 to form the plurality of beams 13 downstream of the protective plate 41. A deflector plate 49 having a central portion 51 of a thickness $d_3$ of about 50 μm in the present example is disposed downstream of the central portion 43 of protective plate 41 such that a gap of a width $d_2$ of about 1000 μm in the present example is formed between the central portions 43, 51 of the protective plate 41 and deflector plate 49. The deflector plate 49 has a plurality of apertures 53 which are registered to the apertures 45 of the protective plate such that each pair of apertures 45 and 53 has a common central axis 55. The apertures 53 have a diameter of about 7 μm in the present example which is larger than the diameter of apertures 45 of the protective plate such that the beams 13 formed by the apertures 45 will traverse the apertures 53 of the deflector plate 49 without any contact with side walls of the apertures 53.

Additional through-holes (not shown in FIGS. 2 and 3) may be formed in the deflector plate 49 and/or the protective plate 41. The additional holes are disposed outside of the region where the electron beam 9 is incident on the protective plate 41 and have a function of improving a vacuum in the gap formed between the protective plate 41 and the deflector plate 49. For this purpose, the additional apertures may have a greater diameter than the apertures 45 and 53 traversed by the electron beams 13. For example, plural additional through-holes of a diameter of 100 μm may be formed to have a total area of about 1 mm$^2$ to 100 mm$^2$.

The deflector plate 49 carries a plurality of electrodes 57, 58 extending from an upper surface 59 of the central portion 51 of the deflector plate 49 into the gap formed between the deflector plate 49 and the protective plate 41. Each aperture 53 has a pair of electrodes 57, 58 associated therewith and contacted to a switching circuitry such that an electrical field indicated by arrows 61 in FIG. 3 may be selectively generated between each pair of electrodes 57, 58. The electrical field 61 deflects the electron beam 13' by an angle α relative to the common axis 55 of apertures 45 and 53. The deflection angle α is sufficient to prevent that beam 13' traverses the hole 17 of aperture plate 19 and, thus, the beam 13' does not contribute to generating the exposure pattern on the wafer surface 23. The beams 13 traversing electrodes 57, 58, between which the electrical field is not switched on, will traverse the apertures 53 along the common axis 55 substantially without deflection. These beams 13 will traverse the central hole 17 of aperture plate 19 and contribute to generating the exposure pattern on the wafer surface 23.

The protective plate 41 has a frame portion 63 surrounding the central portion 43, wherein the frame portion 63 has an increased thickness $d_4$ of about 700 μm, wherein the thickness of the protective plate 41 continuously increases within a slanted region 65 from its value $d_1$ within the central portion 43 to its value $d_4$ in the frame portion. Similarly, the deflector plate 49 has a frame portion 67 having a thickness $d_5$ of about 700 μm surrounding the central portion 51 of the deflector plate 49, wherein the thickness of the deflector plate increases from the value $d_3$ within the central portion 51 to the value $d_5$ in a slanted portion 69. The slanted portion 69 is formed on a lower surface 68 of the deflector plate 49, and the slanted portion 65 of the protective plate is provided on the upper surface 47 thereof, while a lower surface 72 of the protective plate 41 and the upper surface 59 of the deflector plate 49 are flat, plane-shaped surfaces extending from the central portions 43, 51 to the frame portions 63, 67.

Figure 4:
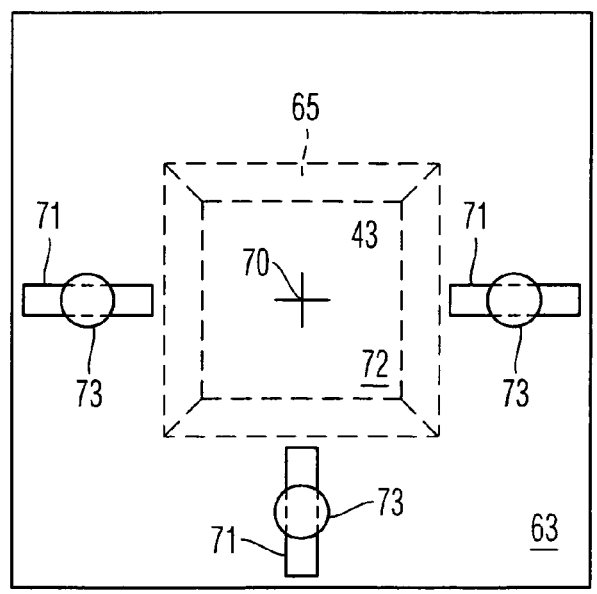
FIG. 4 is an elevational view of a portion of the beam manipulating arrangement shown in FIG. 2.

The mounting of the protective plates 41 and the deflector plate 49 relative to each other will now be illustrated with reference to FIGS. 2 and 4, wherein FIG. 4 shows an elevational view of the lower surface 72 of the protective plate 41.

Three grooves 71 are formed in the frame portion 63 of the protective plate 41, wherein each groove 71 is oriented in a radial direction relative to a central axis 70 of the system. Two of the grooves 51 are aligned along a common axis extending through the center 70 and one of the grooves 71 is aligned along a line oriented orthogonally relative to the line extending between the other grooves. A ball having a diameter which is greater than a width of the grooves 71 is engaged in each of the grooves 71. Grooves 74 are formed in the frame portion 67 of the deflector plate 49 in a pattern coinciding with the pattern of the grooves 71 formed in the frame portion 63 of the protective plate 41. The balls 73 also engage the grooves 74 such that the balls 73 maintain the gap $d_2$ between the deflector and protective plates 49, 41. The ball mounting structures for maintaining the position of plates 41, 49 relative to each other allows for thermal expansion of each of plates 41 and 49 independently from each other wherein an alignment or registration of the center 70 of the protective plate will be maintained relative to a center of the deflector plate.

A similar mounting mechanism is provided for mounting the deflector plate 49 relative to a support 75. Three balls 76 are engaged with grooves 79 formed in the bottom surface 68 of the frame portion 67 of deflector plate 49 and a corresponding groove 78 formed in the support 75.

A heater 81 comprising a ring-shaped body 83 having a lower surface 85 is disposed at a distance from the protective plate 41 such that a small gap of about 1000 μm is formed between the lower surface 85 of the heater body 83 and the upper surface 47 of the frame portion 63 of the protective plate 41. The heater 81 has a plurality of resistors 87 which are in contact with the body 83, and terminals 89 are provided to supply electrical power to the resistor 87 to generate heat and rise the temperature of the heater body 83 above room temperature. A portion of the generated heat is emitted from a lower surface 85 of the heater body 83 and absorbed as a radiation indicated by arrows 91 in FIG. 2 by the upper surface 47 of the frame portion 63 of the protective plate 41 such that also the temperature of the frame portion 63 will rise above room temperature. The energy supplied to the heater 81 is controlled such that the temperature of the frame portion 63 of the protective plate 41 is substantially the same as the temperature of the central portion 43 of the protective plate 41. The temperature of the central portion 43 is an elevated temperature above room temperature due to the energy deposited in the substrate material of the plate 41 by the electrons of beam 9 not traversing the apertures 45. Due to the control of the heater such that the temperatures of the central portion 43 and the frame portion 63 of the protective plate are substantially the same, it is possible to avoid internal stress and corresponding deformation of the protective plate.

The heat deposited in the central portion 43 of the protective plate 41 by the incident electrons of beam 9 is transferred away from the plate 41 by radiation as indicated by exemplary arrows 95 in FIG. 2. A heat sink 97 is provided for enhancing the radiation cooling of the central portion 43 of protective plate 41. The heat sink 97 has a ring-shaped body 99 having an inner cylindrical surface 101 centered about the main axis 70. The body 99 of heat sink 97 is maintained at a suitable temperature below or above room temperature by a cooling liquid flowing through pipes 103 contacting the body 99. The surface 101 is processed such that it has a relatively high thermal emissivity, whereas a surface 105 of the body 99 facing towards the frame portion 63 of the protective plate 41 is processed such that it has a low thermal emissivity to reduce an amount of heat transferred from the frame portion 63 to the heat sink 97. Similarly, a surface 107 of the body 99 is processed such that it has a low thermal emissivity to reduce an amount of heat transferred from the heater 81 directly to the heat sink 97.

A heater 81' for heating the frame portion 67 of the deflector plate 49 and a heat sink 97' for cooling the central portion of the deflector plate 49 have a similar configuration as the heater 81 and heat sink 97 for maintaining the temperatures of the frame and central portions 63 and 43 of the protective plate. Therefore, components of the heater 81' and heat sink 97' are indicated by the same reference numerals as the corresponding components of the heater 81 and heat sink 97 and have been supplemented with an apostrophe, and reference should be made to the illustration given above for understanding the structures and functions of these components.

The heat sink 97' also provides the mounting structure 75 for the deflector plate 49 and carries the groove 78 engaged by ball 76.

Heat is generated in the central portion 51 of the deflector plate 49 due to the operation of circuit device elements of the circuitry for controlling the deflecting electrodes 57, 58. This heat is radiated towards the heat sink 97', and the frame portion 67 of the deflector plate is maintained by the heater 81' at a temperature which is substantially equal to the temperature of the central portion 51.

Figure 5:
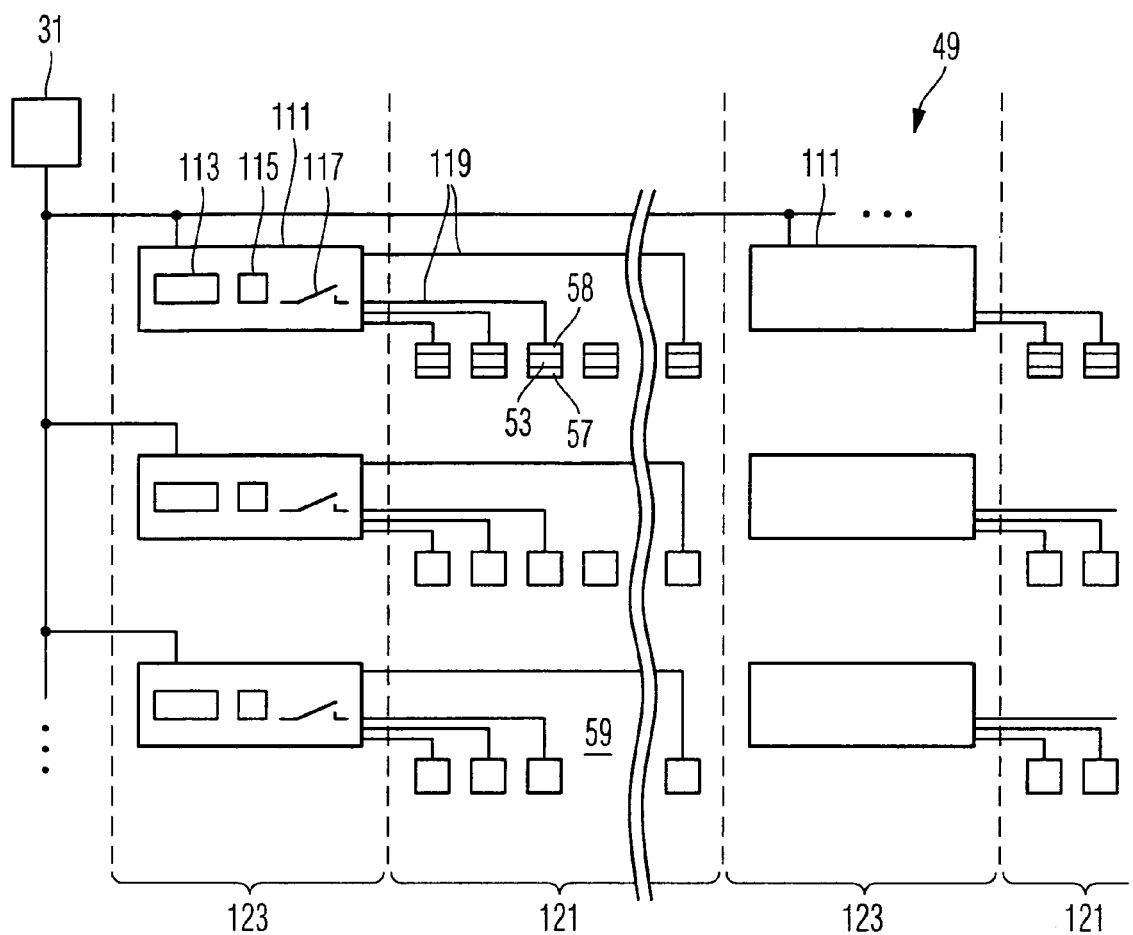
FIG. 5 is an elevational view of a deflector plate of the beam manipulating arrangement shown in FIG. 2.

FIG. 5 shows an elevational view of the upper surface 59 of the deflector plate 49. The upper surface 59 carries the deflecting electrodes 57, 58 and circuitry 111 for supplying the voltages to the electrodes 57, 58 to selectively generate deflecting electrical fields 61 there between under the control of the pattern generator 31. The circuitry 111 comprises various circuit device elements such as memories 113, shift registers 115 and switches 117 which are schematically indicated in FIG. 5. The device elements may be manufactured by conventional methods, such as lithographic methods, on the silicon substrate of the central portion 51 of the deflector plate 49.

The apertures 53 and associated electrodes 57, 58 are arranged in groups across the surface of the central portion 51 of the plate 49. The apertures 53 are arranged in regions 121, whereas no apertures are formed in regions 123 of the plate 49 where main portions of the circuitry are provided. Thus, a number of apertures 53 per unit area is high in regions 121 and low in regions 123, whereas a density of circuit device elements is high in regions 123 and low in regions 121. Conductors 119 are provided for supplying the voltages outputted by a circuit portion 111 to the electrodes 58 connected to the circuit portion 111.

Since the operation of the circuit elements generates heat, it is apparent that an amount of heat generated per unit area in the regions 123 is higher than an amount of heat generated in the regions 121, and a temperature of the plate 49 will be higher within regions 123 as compared to regions 121.

Figure 6:
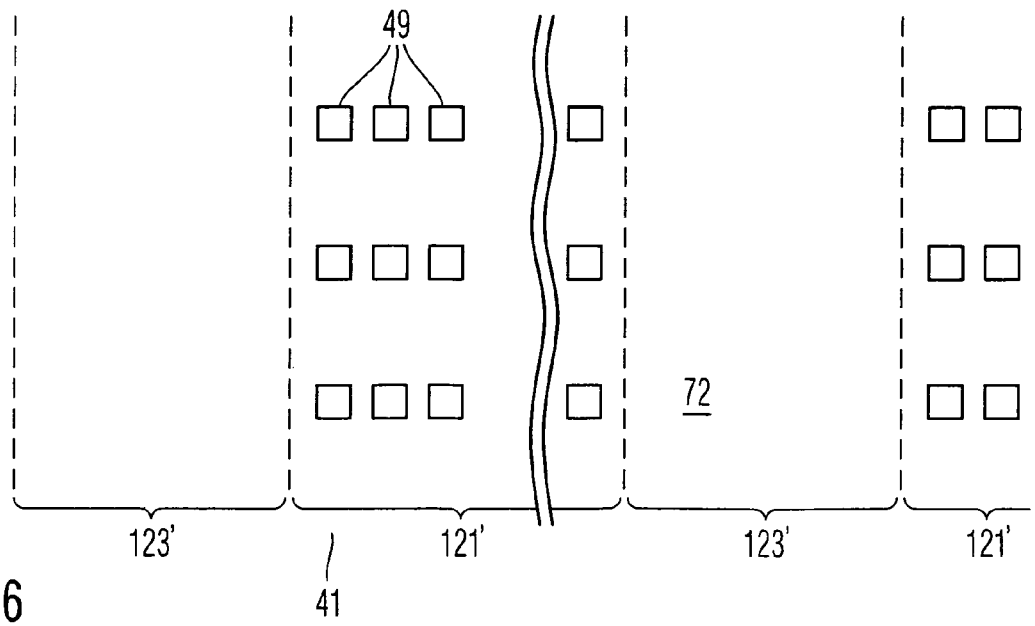
FIG. 6 is an elevational view of a protective plate of the beam manipulating arrangement shown in FIG. 2.

FIG. 6 shows an elevational view of the lower surface 72 of the protective plate 41. Since the apertures 49 of the protective plate are registered and aligned with the corresponding apertures 53 of the deflector plate, the protective plate has regions 121' with a high number of apertures 49 per unit area and regions 123' with a low number of apertures per unit area. The regions 123' of the protective plate 41 are located opposite to the regions 123 of the deflector plate 49 where the heat deposited in the deflector plate is mainly generated.

The surface 72 of the protective plate 41 is processed such that it has a higher thermal emissivity within regions 123' than in regions 121'. The higher thermal emissivity within regions 123' has an effect of enhancing a radiation cooling of the regions 123 of the deflector plate 49 relative to a radiation cooling of the regions 121 of the deflector plate. The enhanced radiation cooling of the regions 123 is effected to reduce temperature gradients across the central portion 51 of the deflector plate 49. This has a consequence of reducing thermal stresses within the plate 49 and misalignments of the apertures 53 of the deflector plate 49.

The different thermal emissivities in the regions 123' and 121' may be obtained by different processing of the surface 72. For example, carbon or some other suitable material may be evaporated or sputtered onto the surface 72 within the regions 123', whereas carbon is not applied to the surface 72 within regions 121'. It is also possible, to apply coating of carbon or some other suitable material on the whole surface 72 and to remove amounts of carbon within the regions 121'. The coating may be removed in a pattern, such as stripes or some other suitable pattern in regions 121'.

It is further possible to apply a coating formed of metal within region 121' of the surface 72, resulting in a lowering of the emissivity in that region. Further, the surface may be processed to have a three-dimensional structure to locally control the emissivity of the plate. For example, a grating or a pattern of trenches may be formed on the surface.

In view of a further reduction of temperature gradients in the central portion 51 of the deflector plate 49, the lower surface 68 of the deflector plate 49 is processed in a similar way as illustrated above for the lower surface of the protective plate 41. Thus, also the lower surface 68 of the deflector plate 49 has regions corresponding to the regions 123 on the upper surface 59 where the thermal emissivity is higher than in other regions opposite to the regions 121 on the upper surface 59.

Further, also the upper surface 47 of the protective plate 41 has regions opposite to the regions 123' of the lower surface 72 where the thermal emissivity may be configured to be higher than in other regions opposite to the regions 121' of the lower surface 72.

With the above illustrated embodiments, it is further possible to supply heat to the arrangement formed of the protective plate and the deflector plate. The corresponding raise of temperature of the arrangement may have an effect of reducing or removing contaminations deposited on the arrangement during the operation of the system. Such contaminations may be formed from hydro-carbons or other gases contained in the vacuum and deposited on the arrangement due to electrical charges inducted by the electron beams. A temperature of about 70° C. to 120° C. may be suitable for reducing contaminations on the arrangement. Further, the arrangement may be continuously maintained on such elevated temperature, or the temperature of the arrangement may be raised from time to time to reduce contaminations deposited during the operation of the system at a lower temperature of the arrangement.

In the above illustrated embodiments heat transfer by radiation is the main mechanism for transferring heat between the protective plate and the deflector plate. However, it is also possible to provide additional heat conductors between those plates. For example, a heat bridge formed of a wire or metal which is elastically deformed may be interposed between the plates to maintain a mechanical contact between the plates due to the spring force generated by the elastic deformation. Such heat bridges may be advantageously disposed close to the balls interposed between the plates such that the mechanical force exerted by the elastically deformed heat bridges will have a reduced bending effect on the plates.

To summarize, embodiments of the present invention relate to a beam manipulating arrangement for a multi beam application using charged particles comprises a multi-aperture plate having plural apertures traversed by beams of charged particles. A frame portion of the multi-aperture plate is heated to reduce temperature gradients within the multi-aperture plate. Further, a heat emissivity of a surface of the multi-aperture plate may be higher in some regions as compared to other regions in view of also reducing temperature gradients.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A beam manipulating arrangement for deflecting a plurality of charged particle beams, the arrangement comprising:
a first plate having a central portion defining a plurality of apertures, and a frame portion outside of the central portion, the first plate carrying a plurality of deflectors positioned in the central portion of the first plate and a switching circuitry positioned in the central portion of the first plate, wherein each of the plurality of apertures has a deflector associated therewith, the deflector being electrically connected to the switching circuitry and configured to deflect a charged particle beam traversing the aperture;
a second plate disposed opposite to the first plate such that a gap is formed between the second plate and the first plate, the second plate having a central portion defining a plurality of apertures and a frame portion outside of the central portion,
wherein the apertures of the second plate are registered relative to the apertures of the first plate such that the beams of charged particles may traverse the second plate and the first plate; and
at least one heater thermally coupled to the frame portion of the first plate.

2. The beam manipulating arrangement according to claim 1, wherein the heater has a body having a heat emitting surface opposite to a heat receiving surface portion of the second plate such that a gap is formed there between.

3. The beam manipulating arrangement according to claim 1, further comprising a heat sink having at least one inner heat receiving surface oriented transversely to directions of extension of the first plate and the second plate.

4. The beam manipulating arrangement according to claim 3, wherein the at least one heat receiving surface of the heat sink extends away from one of the frame portion of the first plate and the frame portion of the second plate.

5. The beam manipulating arrangement according to claim 4, wherein the heat sink is free of any direct mechanical contact with one of the frame portion of the first plate and the frame portion of the second plate.

6. The beam manipulating arrangement according to claim 3, wherein the heat sink has an outer surface facing towards the heater and wherein a thermal emissivity of the heat receiving surface is higher than a thermal emissivity of the outer surface.

7. The beam manipulating arrangement according to claim 3, wherein the heat sink comprises at least one liquid pipe.

8. The beam manipulating arrangement according to claim 1, wherein the heater comprises at least one resistor having terminals for supplying a heating current.

9. A charged particle beam system, comprising:
a charged particle source for generating at least one beam of charged particles;
the beam manipulating arrangement according to claim 1 disposed in a beam path of the beam of charged particles;
a stage for mounting a substrate surface in a target plane relative to the beam manipulating arrangement; and
a charged particle optics configured to direct beams of charged particles traversing apertures of the beam manipulating arrangement onto the target plane.

10. The beam manipulating arrangement according to claim 1, wherein the at least one heater is thermally coupled to the frame portion of the first plate, such that heat generated by the heater increases a temperature of the frame portion of the first plate relative to the temperature of the central portion of the first plate.

11. The beam manipulating arrangement according to claim 1, wherein the at least one heater is thermally coupled to the frame portion of the second plate, such that heat generated by the heater increases a temperature of the frame portion of the second plate relative to the temperature of the central portion of the second plate.

12. The beam manipulating arrangement according to claim 1, wherein the at least one heater is thermally coupled to the frame portion of the first plate, such that heat generated by the heater maintains the frame portion of the first plate at a temperature which is substantially equal to the temperature of the central portion of the first plate.

13. A beam manipulating arrangement for deflecting a plurality of charged particle beams, the arrangement comprising:
a first plate having a central portion defining a plurality of apertures, and a frame portion outside of the central portion, the first plate carrying a plurality of deflectors positioned in the central portion of the first plate and a switching circuitry positioned in the central portion of the first plate, wherein each of the plurality of apertures has a deflector associated therewith, the deflector being electrically connected to the switching circuitry and configured to deflect a charged particle beam traversing the aperture; and
a second plate disposed opposite to the first plate such that a gap is formed between the second plate and the first plate, the second plate having a central portion defining a plurality of apertures and a frame portion outside of the central portion,
wherein the apertures of the second plate are registered relative to the apertures of the first plate such that the beams of charged particles may traverse the second plate and the first plate,
wherein the switching circuitry comprises a plurality of circuit device elements,
wherein the central portion of the first plate has a first region in which a number of circuit device elements per unit area of the first plate has a first value,
wherein the central portion of the first plate has a second region in which the number of circuit device elements per unit area of the first plate has a second value greater than the first value;
wherein at least one of first and second surfaces of the second plate has a first region opposite the first region of the first plate having a first heat emissivity, and a second region opposite the second region of the first plate having a second heat emissivity greater than the first heat emissivity.

14. The beam manipulating arrangement according to claim 13, wherein the circuit device elements include memory cells and shift registers.

15. The beam manipulating arrangement according to claim 13, wherein a density of apertures per unit area of the first plate in the first region of the central portion of the first plate is higher than in the second region thereof.

16. The beam manipulating arrangement according to claim 15, wherein the beam manipulating arrangement comprises three balls disposed at a distance from each other and each engaging corresponding grooves provided in the first plate and second plate respectively.

17. The beam manipulating arrangement according to claim 16, wherein two grooves provided in the first plate extend in different directions.

18. A beam manipulating arrangement for deflecting a plurality of charged particle beams, the arrangement comprising:

a first plate having a central portion defining a plurality of apertures, and a frame portion outside of the central portion, the first plate carrying a plurality of deflectors positioned in the central portion of the first plate and a switching circuitry positioned in the central portion of the first plate, wherein each of the plurality of apertures has a deflector associated therewith, the deflector being electrically connected to the switching circuitry and configured to deflect a charged particle beam traversing the aperture;

a second plate disposed opposite to the first plate such that a gap is formed between the second plate and the first plate, the second plate having a central portion defining a plurality of apertures and a frame portion outside of the central portion, wherein the apertures of the second plate are registered relative to the apertures of the first plate such that the beams of charged particles may traverse the second plate and the first plate, and at least one ball disposed between the first plate and the second plate, wherein the ball is engaged with a groove formed in the frame portion of the first plate and with a groove formed in the frame portion of the second plate.

* * * * *